United States Patent [19]

Suret et al.

[11] Patent Number: 5,091,827
[45] Date of Patent: Feb. 25, 1992

[54] ELECTROMAGNETICALLY COMPATIBLE VERTICAL ENCLOSURE FOR THE OPERATING SYSTEM OF TRANSMISSION EQUIPMENT, IN PARTICULAR FOR TRANSMISSION BY RADIO BEAM

[75] Inventors: Michel Suret, Eaubonne; Gérard Reltgen, Levallois-Perret; Serge Morin, Paris, all of France

[73] Assignee: A.T.F.H., Cedex, France

[21] Appl. No.: 617,754

[22] Filed: Nov. 26, 1990

[30] Foreign Application Priority Data

Nov. 29, 1989 [FR] France ................................. 89 15714

[51] Int. Cl.⁵ ............................ H05K 7/20; H05K 9/00
[52] U.S. Cl. ................................ 361/424; 174/35 GC; 174/35 MS; 312/223; 361/383
[58] Field of Search .......... 174/35 R, 35 GC, 35 MS, 174/16.1; 165/80.3; 455/347–349; 361/212, 220, 356, 365, 341, 383, 382, 384, 393, 394, 390, 391, 380, 395, 424; 312/223

[56] References Cited

U.S. PATENT DOCUMENTS

| | | | |
|---|---|---|---|
| 3,594,490 | 7/1971 | Mitchell | 174/35 MS |
| 3,675,085 | 8/1971 | Stanback | 361/365 |
| 3,913,997 | 10/1975 | Pull | 174/35 MS |
| 4,399,317 | 8/1983 | Van Dyke, Jr. | 174/35 GC |
| 4,532,574 | 7/1985 | Reiner | 361/365 |
| 4,555,744 | 11/1985 | Maroney | 361/212 |
| 4,616,101 | 10/1986 | Veerman | 174/35 MS |
| 4,964,018 | 10/1990 | Mallory | 361/391 |
| 4,982,053 | 1/1991 | Thornley | 174/35 MS |
| 5,008,775 | 4/1991 | Schindler | 361/383 |

FOREIGN PATENT DOCUMENTS

| | | |
|---|---|---|
| 0266121 | 5/1988 | European Pat. Off. . |
| 1894754 | 9/1963 | Fed. Rep. of Germany . |
| 3633209 | 3/1988 | Fed. Rep. of Germany . |
| 8716277 | 3/1988 | Fed. Rep. of Germany . |

OTHER PUBLICATIONS

Philips Telecommunication Review, vol. 43, No. 1, Apr. 1985, Hilversum, NL, pp. 12–16; K. Brokkelkamp: "Electro–Magnetic Compatibility in Degin 400–Slim".

Primary Examiner—Gerald P. Tolin
Attorney, Agent, or Firm—Sughrue, Mion, Zinn, Macpeak & Seas

[57] ABSTRACT

An electromagnetically compatible vertical enclosure for the operating system of transmission equipment, in particular for transmission by radio beam, the enclosure containing a set of electrical modules and having a top flap and a bottom flap for closing said structure. The flaps are removable and are hinged at the top and at the bottom of the structure about horizontal axles fixed to the structure, thereby making it possible to provide completely unhindered access to the modules. The invention is particularly suitable for radio beam transmission.

11 Claims, 10 Drawing Sheets

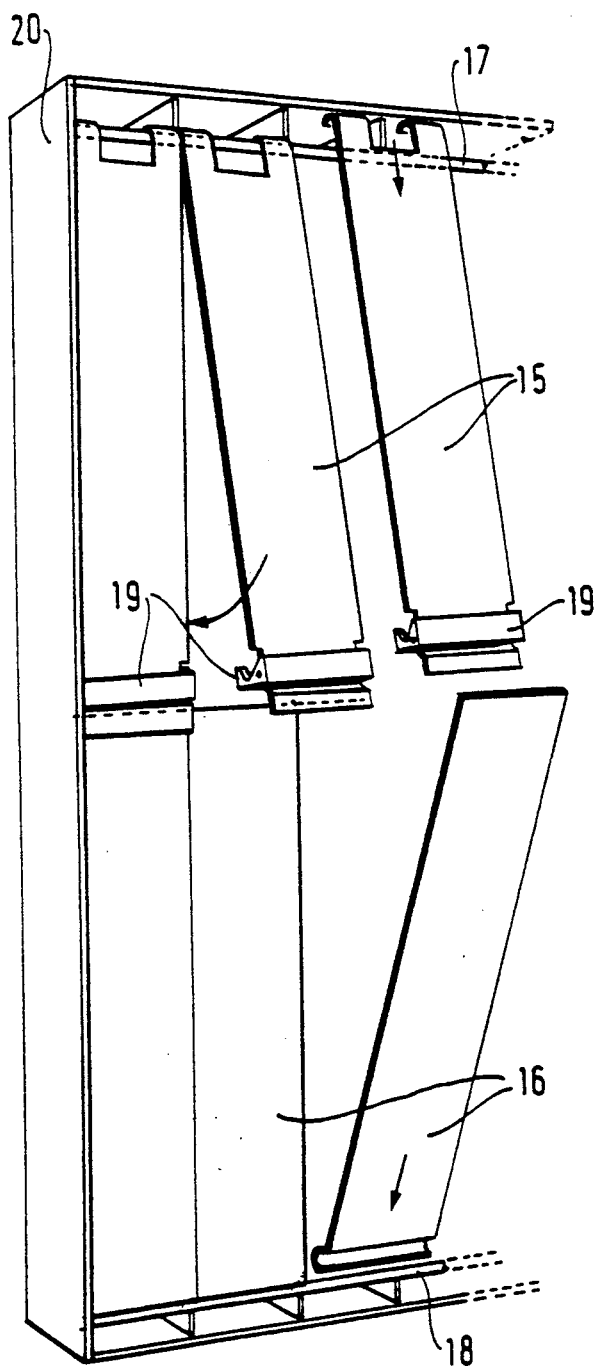
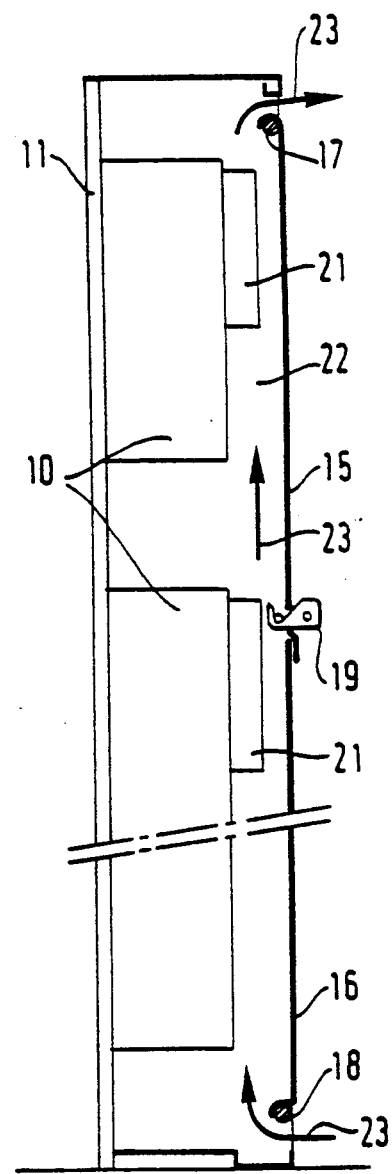
FIG.2
FIG.3

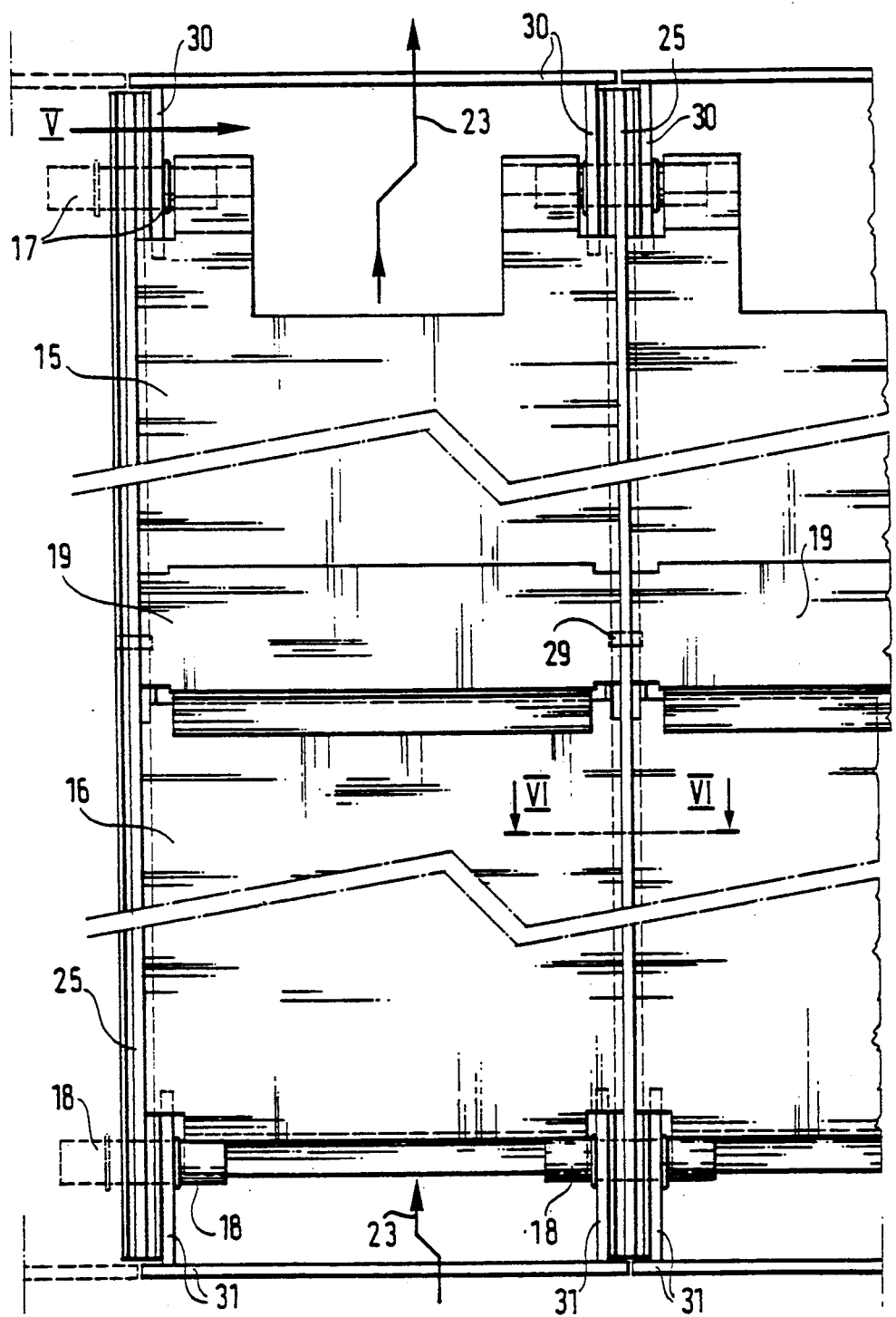

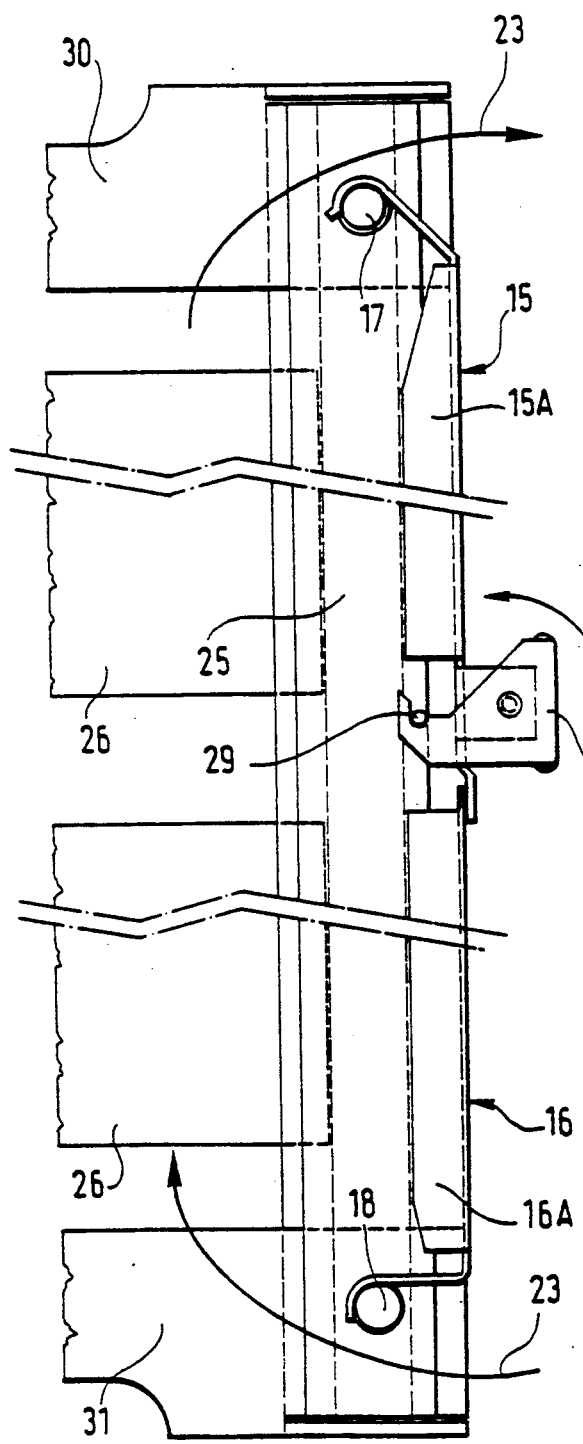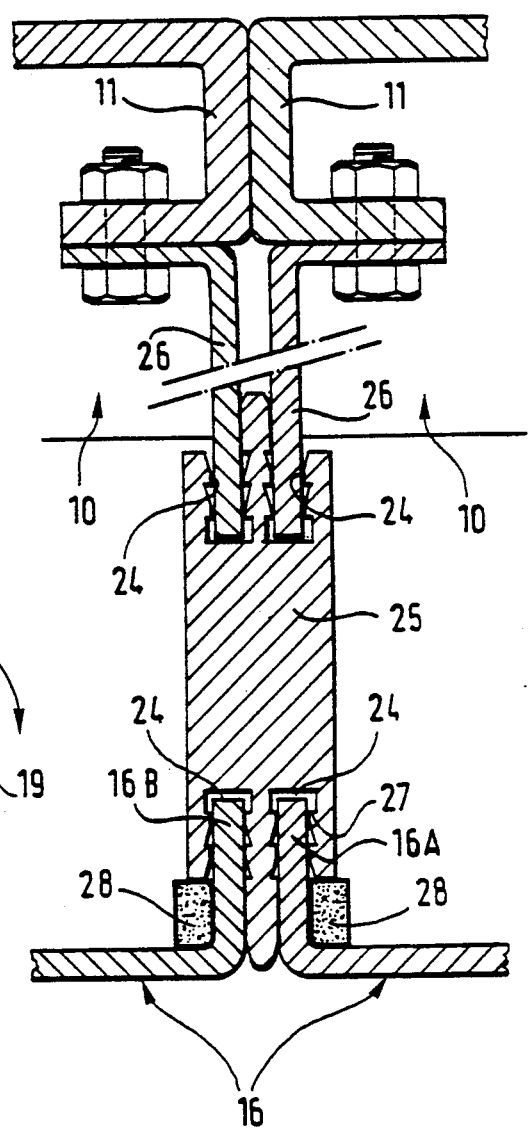

ELECTROMAGNETICALLY COMPATIBLE VERTICAL ENCLOSURE FOR THE OPERATING SYSTEM OF TRANSMISSION EQUIPMENT, IN PARTICULAR FOR TRANSMISSION BY RADIO BEAM

The invention relates to an electromagnetically compatible vertical structure for the operating system of transmission equipment, in particular for transmission by radio beam.

BACKGROUND OF THE INVENTION

The operating systems of transmission equipment, in particular digital radio beam transmission equipment, use such vertical structures placed side by side so as to constitute bays; with the various modules that are mounted in these vertical structures occupying rows that are disposed one above the other.

The object of the invention is to provide a solution to the problem posed by the need to comply with the new electromagnetic compatibility regulations for radio equipment, as specified in France by the Space and Radio Transmission Division of the CNET in its technical specification ST/PAB/ETR/331 of November 1985, entitled (in translation) "Electromagnetic compatibility of intercommunication installations". A degree of sealing against radio radiation and against electrostatic discharges needs to be provided.

SUMMARY OF THE INVENTION

To this end, the present invention provides an electromagnetically compatible vertical enclosure for the operating system of transmission equipment, in particular for transmission by radio beam, the structure being designed to contain a set of electrical modules and comprising a top flap and a bottom flap for closing said structure, said flaps being removable and being hinged at the top and at the bottom of the structure about horizontal axes fixed to said structure, thereby making it possible to provide completely unhindered access to the modules.

BRIEF DESCRIPTION OF THE DRAWINGS

An embodiment of the invention is described by way of example with reference to the accompanying drawings, in which:

FIGS. 2 and 3 are diagrams showing a set of vertical enclosures in accordance with the invention;

FIGS. 4, 5 and 6 show various details illustrating the invention; and

DETAILED DESCRIPTION

Figure 1:
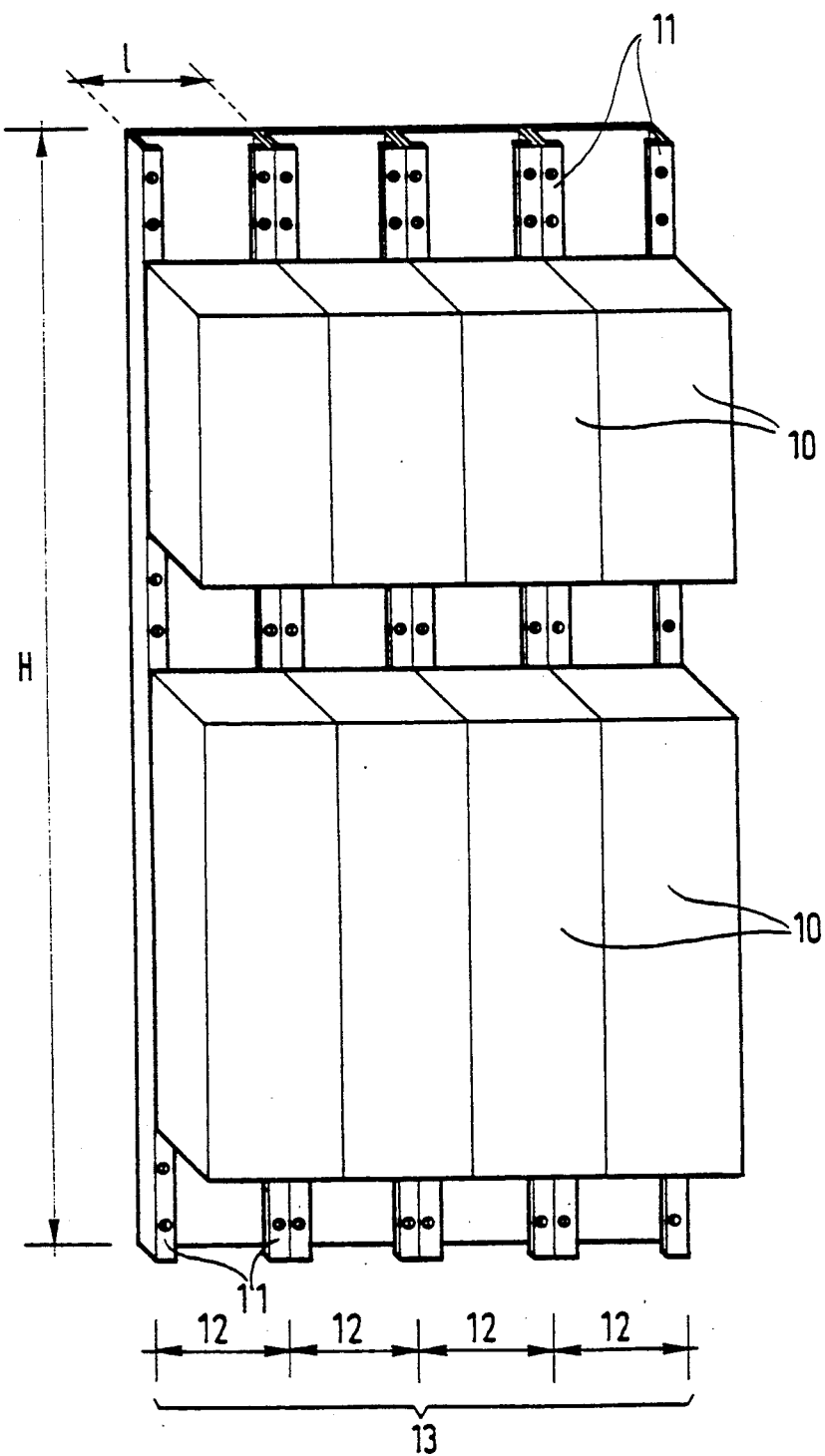
FIG. 1 shows a set of prior art vertical enclosures.
Figure 7:
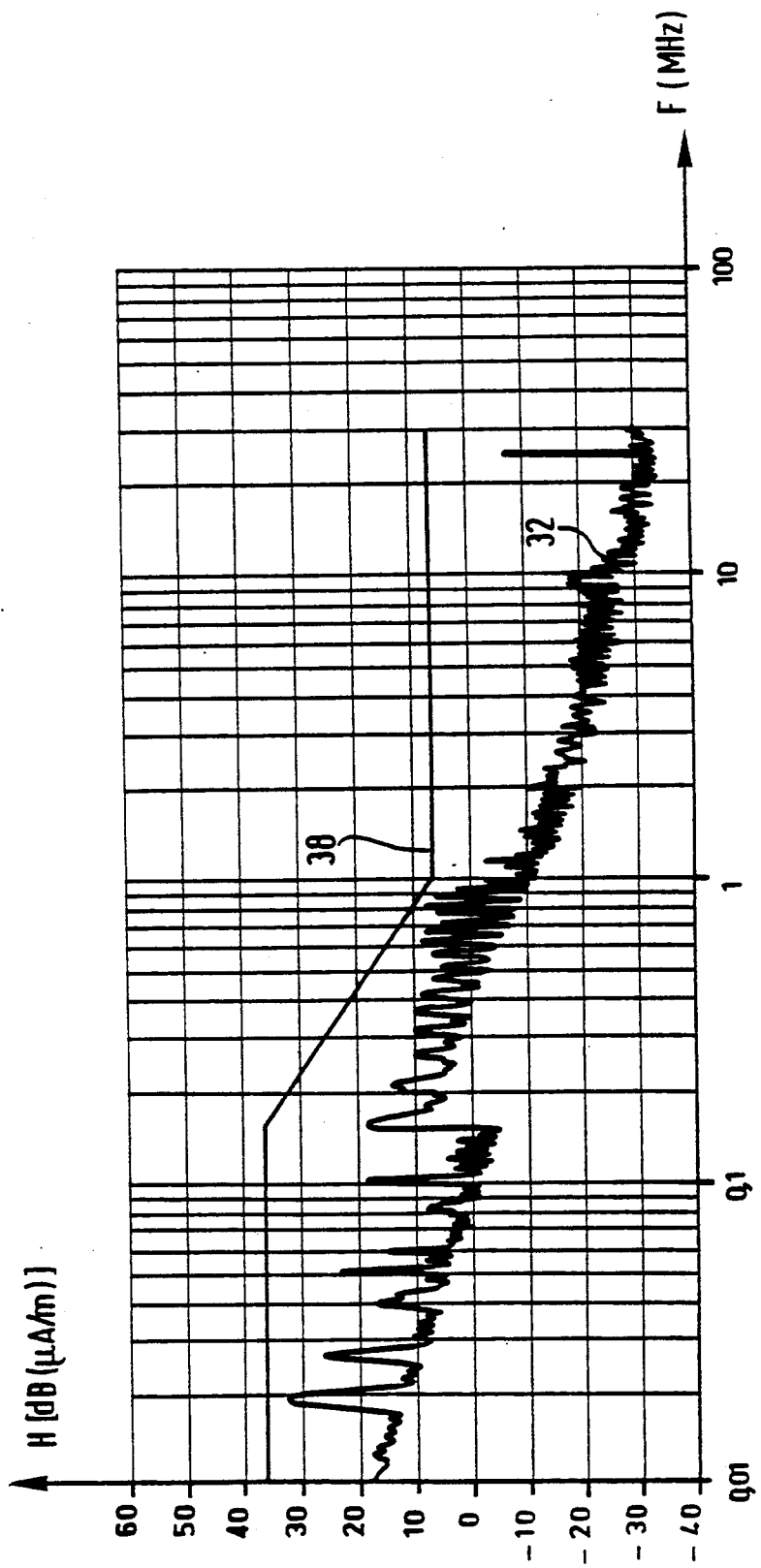
FIGS. 7 to 12 are graphs showing the improvements provided by the invention.

At present, radio equipment (high or medium capacity) is in the form of vertical structures of widths l, e.g. 120 mm, and of height H, e.g. in the range 2 meters (m) to 2.6 m. Thus, as shown in FIG. 1, electrical modules 10 are fixed on vertical uprights 11 to form vertical structures 12 which are assembled to one another to constitute a station 13.

This organization makes it possible to obtain modularity suitable for radio beams, since a vertical structure is often equivalent to a transmission channel.

The composition of different stations varies, but generally lies in the range 4 to 16 vertical structures. It must be possible to add one such vertical structure to an existing station in order to add a channel.

If the modules and their interconnection cables are not given electromagnetic compatibility treatment, then the station will not satisfy the applicable regulation. The problem posed is somewhat contradictory since firstly in order to satisfy the electromagnetic compatibility standards the equipment must be screen using a metal cabinet having as few openings as possible, while secondly, in order to enhance thermal dissipation, it must have as many openings as possible in order to make use of natural convection.

Manufacturers have attempted to solve this problem in various different ways.

In a first attempt, the vertical structure equipment that has not been given electromagnetic compatibility treatment is installed in a cabinet which is designed to contain electromagnetic radiation. This attempt suffers from numerous drawbacks: loss of modularity (if a cabinet contains four vertical structures, then two cabinets will be necessary if five vertical structures are required, and space is thus wasted;

the cost of a cabinet which provides electromagnetic compatibility is high; and the thermal problem is poorly solved since natural convection takes place poorly.

In a second attempt the electrical modules installed in each vertical structure are subjected to electromagnetic compatibility treatment (radiation does not leak out). However such an attempt suffers from the following drawbacks:

cost is very high since the problem must be treated in each module and in the interconnecting cables; and the results are not very satisfactory, since although the modules are responsive to electromagnetic compatibility treatment, it is difficult to protect cabling.

As shown in FIGS. 2 and 3, the invention consists in closing off each vertical enclosure individually with a top metal flap and with a bottom metal flap. These flaps are removable. They are hinged to the top and the bottom of each vertical structure about horizontal axles 17 and 18. Closure of each pair of flaps (15, 16) takes place in the middle by means of a handle 19 disposed at the bottom of each top flap 15. Each of the sides of the set of side-by-side vertical structures is closed by a removable side panel 20.

FIG. 4 shows a front view of a vertical enclosure with its flaps 15 and 16 in the closed position. In this example, the hinge axles are physically embodied by a plurality of colinear short horizontal pins.

In order to provide better protection against radiation leakage, each flap 15 (16) is provided on each side with a 90° corresponding groove 24 formed in a vertical 25 (e.g. made of aluminum) fixed to the frame of the vertical enclosure by the pins 17 and 18, for example.

FIG. 5 is a side view of a vertical enclosure seen along arrow V in FIG. 4, with the flaps 15 and 16 being shown in the closed position and with the corresponding front bars 25 removed. The handle 19 enables the top flap 15 whose bottom end engages the top end of the bottom flap 16 to be fastened to a horizontal catch 29 fixed to the vertical bar 25.

Advantageously, as shown in FIG. 6 which is a section view on plan VI—VI of the vertical structure shown in FIG. 4, each bar 25 is symmetrical in structure: it is provided with two adjacent vertical grooves 24 up each of its edges, with the flanges 15A, 15B, and 16A, 16B of the flaps penetrating into the grooves in one of its edges and with the flanks 26 of the modules 10 penetrating into the grooves in the other edge, and each groove 24 may be provided with projections 27 for improving contact.

An electrically conductive gasket 28 is disposed at the join between each flap 15, 16 and each of its flanges 15A, 15B, or 16A, 16B, thereby further improving radio screening over the full height of the flaps 15 and 16.

The frame of the vertical structure includes a top plate 30 and a bottom plate 31, and each bar 25 is fixed thereto by means of the pins 17 and 18 which pass through the bar 25 and also through the top and bottom plates 30 and 31 of the vertical structure.

The invention thus makes it possible to retain modularity for extending channels and for providing stations with various different numbers of vertical structures.

The flaps 15 and 16 are removable and provide full access to the modules.

An empty space 22 is left between the flaps and the modules to produce a chimney effect which is used for heat dissipation (23). Heat exchangers 21, e.g. finned radiators, are associated with the modules and may e disposed in the "chimney" established in this way.

Electromagnetic compatibility and the ability to withstand electrostatic discharges are both well provided overall in a station (the cabling between vertical structures is well protected).

The cost of such protection is likewise modular.

For example, the invention makes it possible to obtain mean radiation attenuation of 20 dB for an operating system as measured in a waveband running from 10 kHz to 1 GHz.

The curves shown in FIGS. 7 to 12 serve to demonstrate the improvement provided by the invention. These curves show variation in the magnetic field H as a function of frequency F, thereby making it possible to measure the interference radiated outwardly by the equipment, which in this case is constituted by a 140 Mbit radio beam at 6 GHz.

Figure 8:
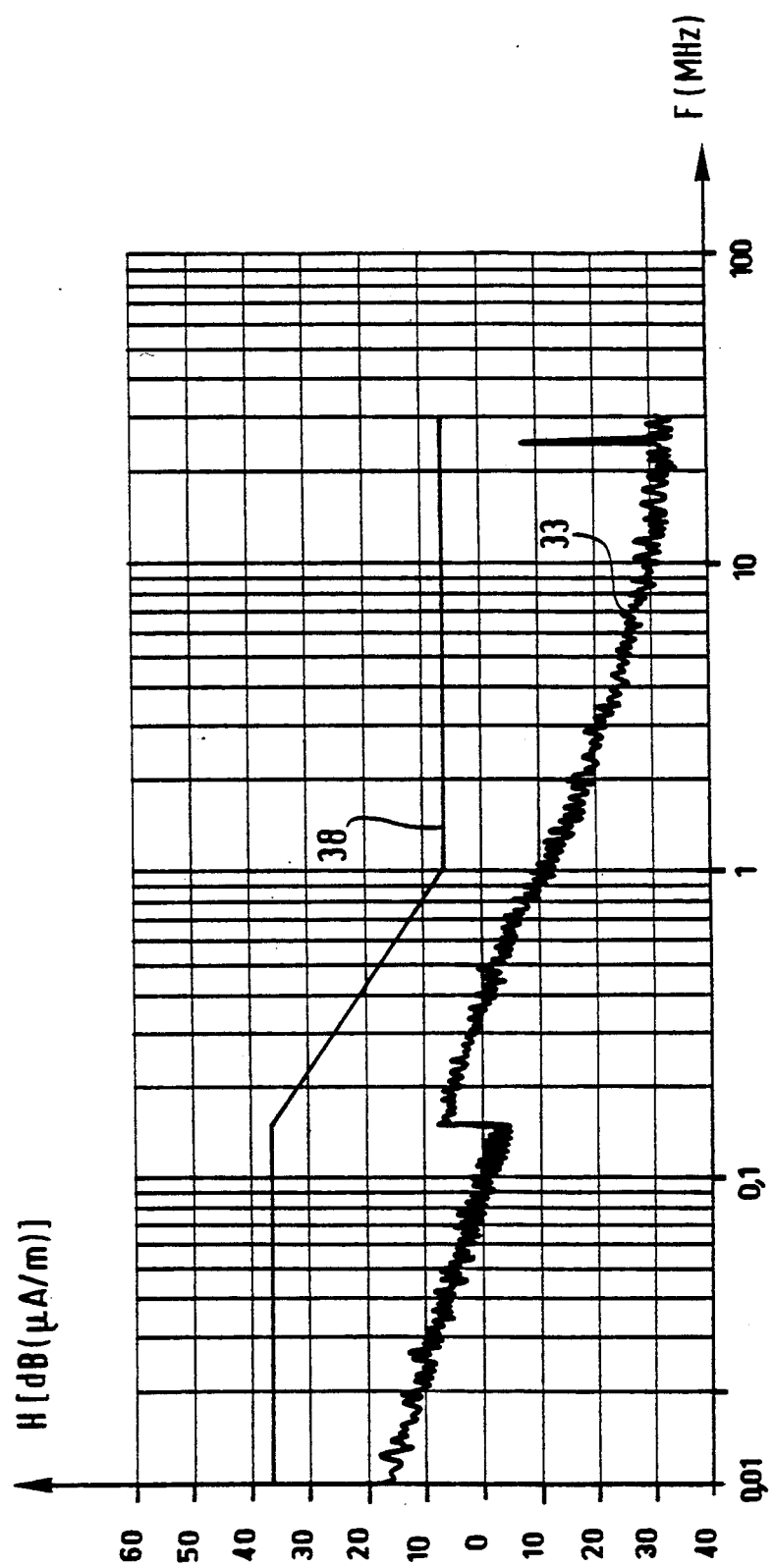
Figure 9:
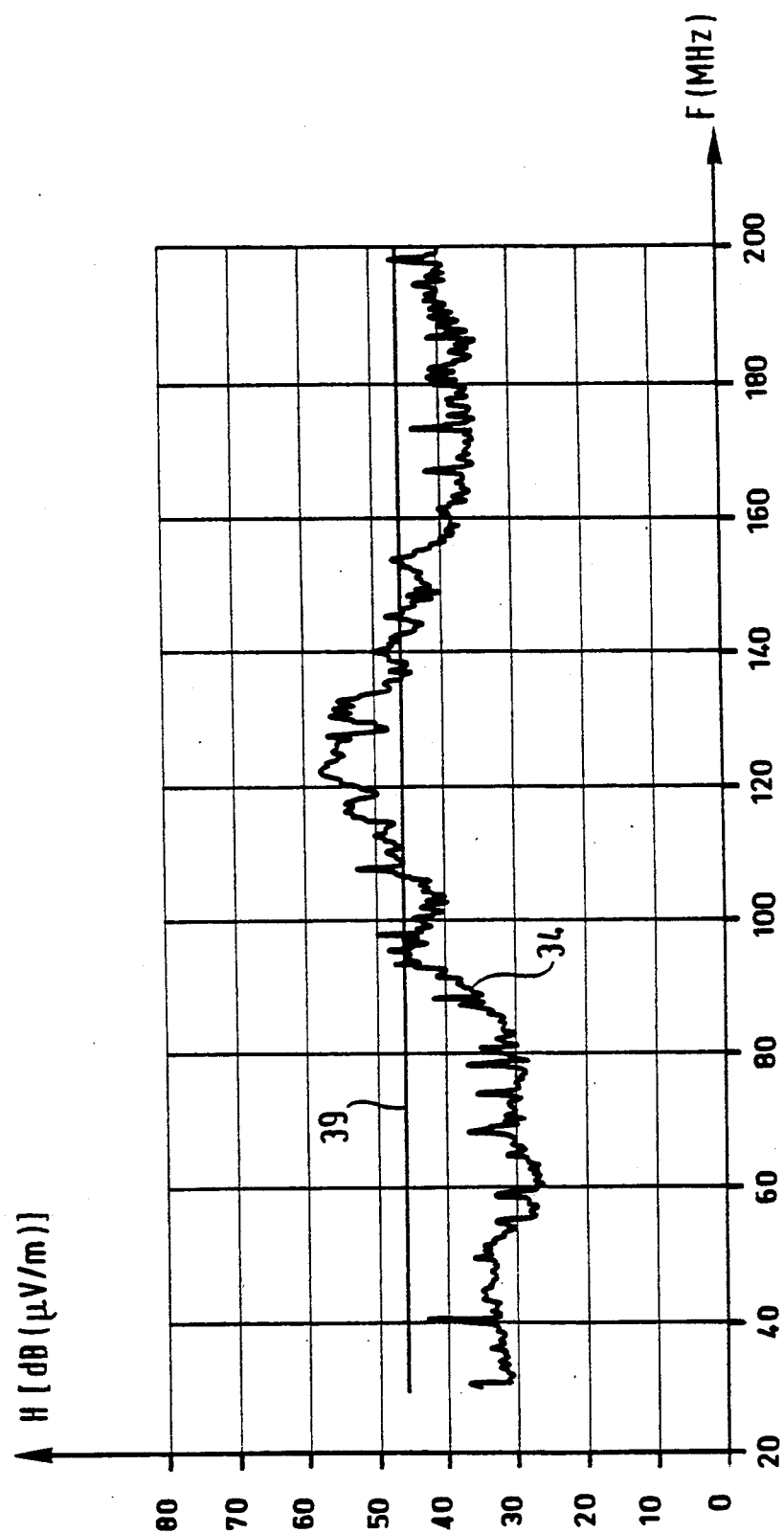

The first two curves 32 and 33 (FIGS. 7 and 8) correspond to a frame antenna operating in the range 10 kHz to 30 MHz, respectively without the flaps 15 and 16 of the invention (FIG. 7) and with these flaps (FIG. 8).

Figure 10:
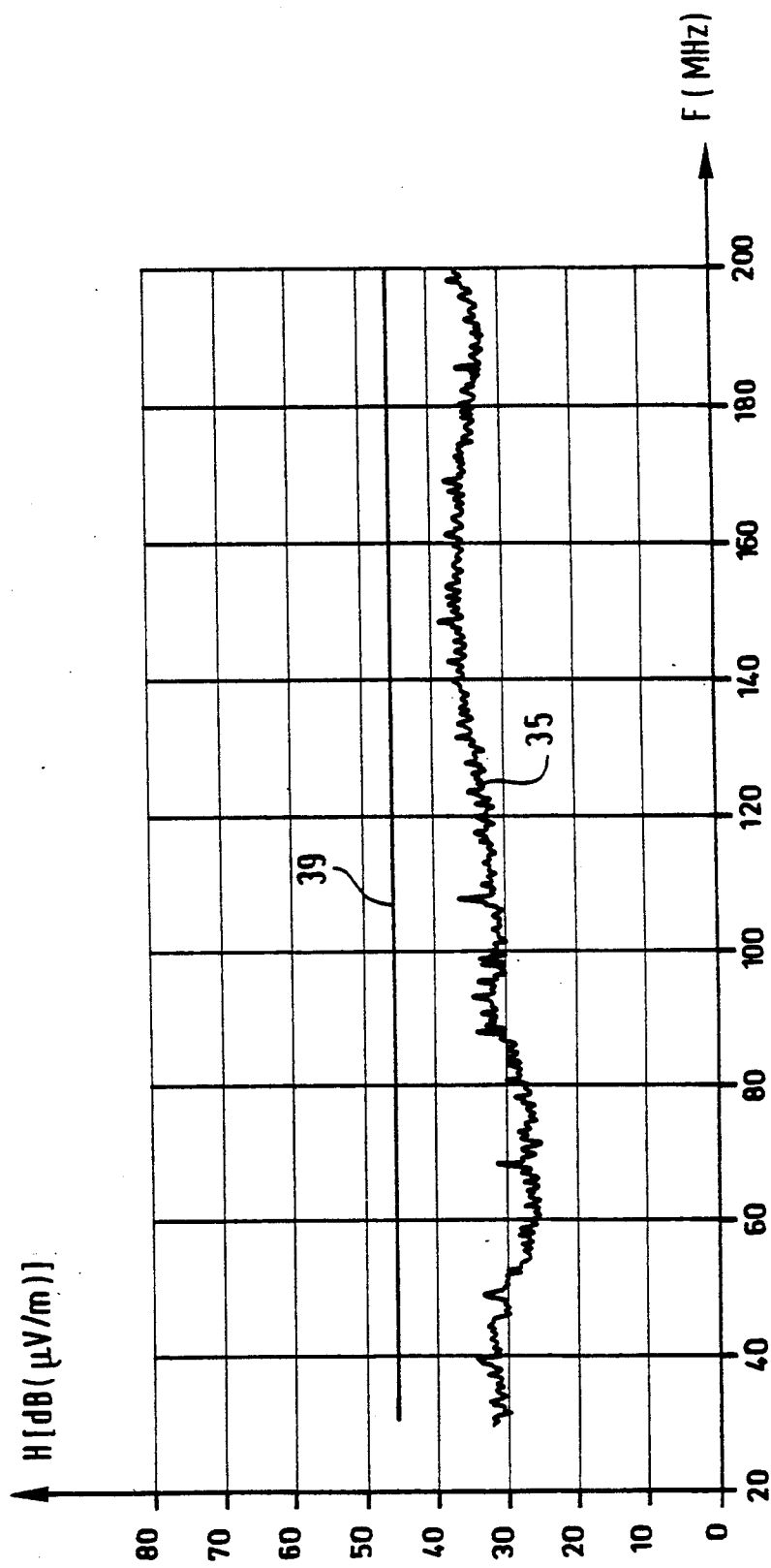
Figure 11:
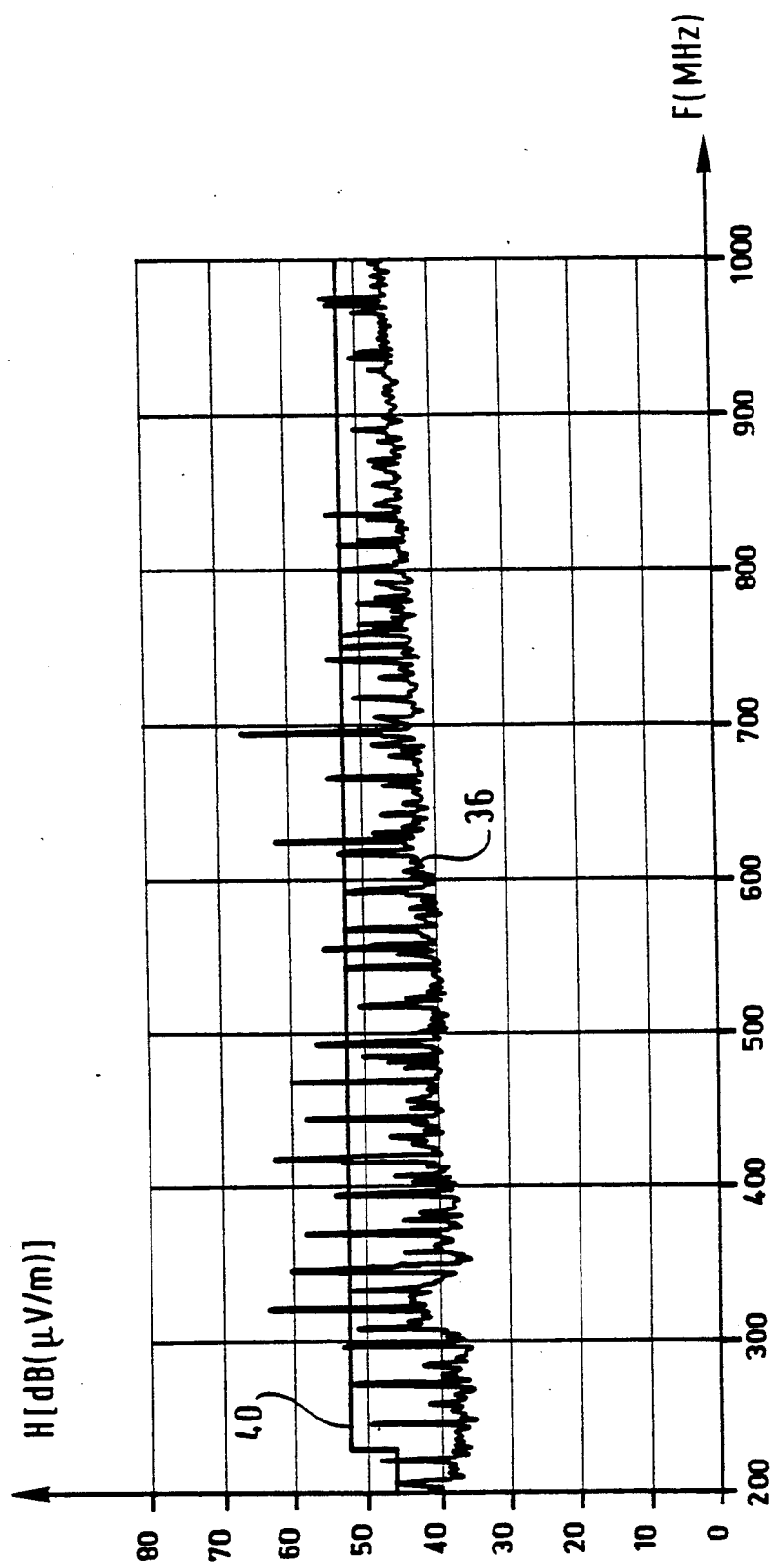

The next two curves 34 and 35 (FIGS. 9 and 10) correspond to a two-cone antenna conveying horizontal polarization and vertical polarization and operating in the range 30 MHz to 200 MHz, respectively without the flaps 15 and 16 (FIG. 9) and with the flaps (FIG. 10).

Figure 12:
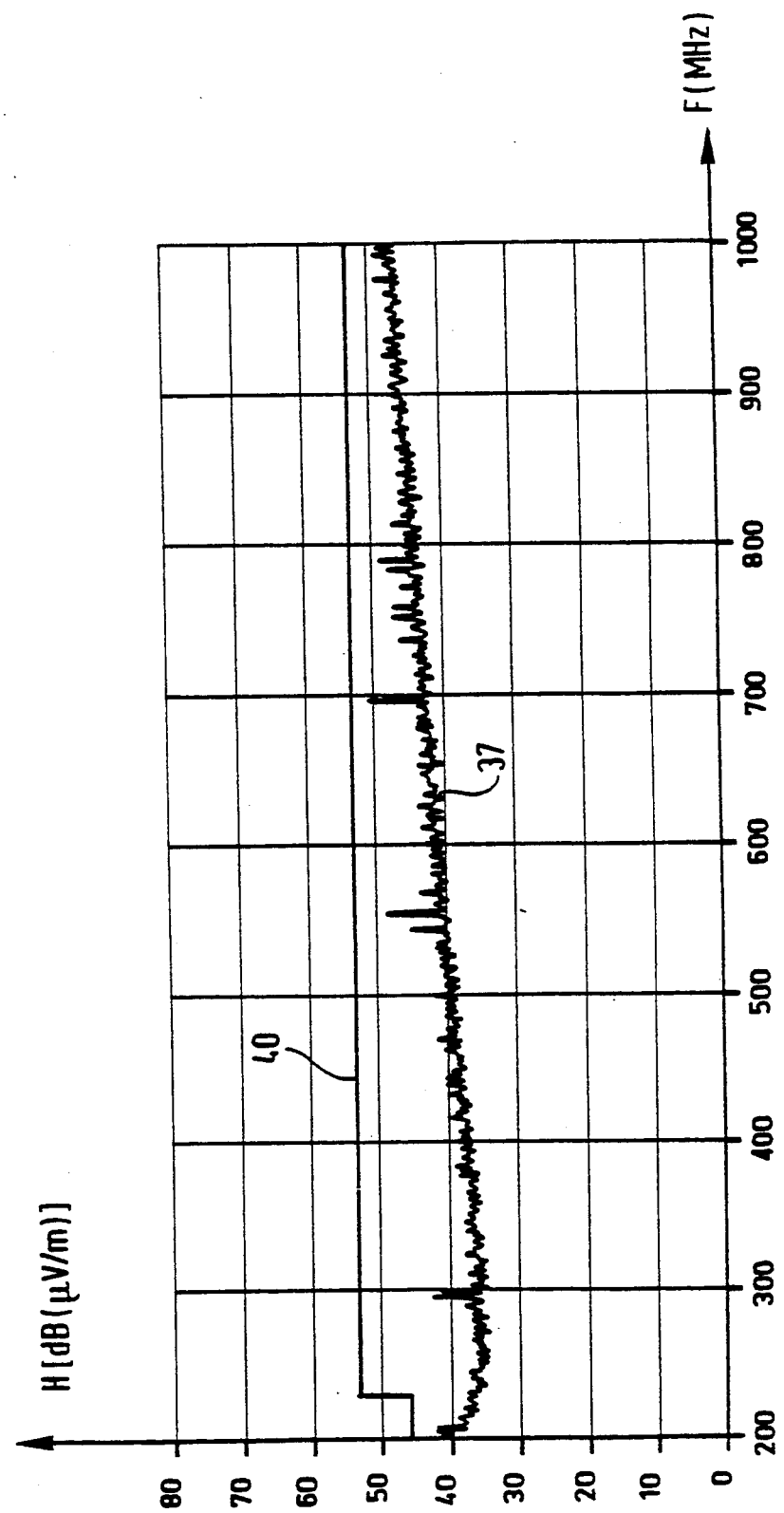

The last two curves 36 and 37 (FIGS. 11 and 12) correspond to a log spiral antenna conveying circular polarization and operating in the range 200 MHz to 1 GHz, respectively without the flaps 15 and 16 (FIG. 11) and with the flaps (FIG. 12).

The frequency characteristics 38, 39, and 40 as laid down by the standards in these different wavebands are also shown in FIGS. 7 to 12.

Naturally, the present invention has been described and shown merely by way of preferred example, and its component parts could be replaced by equivalent parts without thereby going beyond the scope of the invention.

We claim:

1. An electromagnetically compatible vertical enclosure containing a set of electrical modules of an operating system of radio beam transmission equipment, said enclosure comprising:

a top flap and a bottom flap closing off the front of said enclosure, said flaps including removable hinges at the top and at the bottom of said top and bottom flaps respectively and engaged about respective horizontal axles fixed to said enclosure, thereby making it possible to provide completely unhindered access to the modules, the bottom of the top flap overlapping the top of the bottom flap and said enclosure further comprising a handle fixed to one of said top flap and said bottom flap and locking on a catch fixed to the enclosure.

2. A vertical enclosure according to claim 1, wherein the flaps are metal flaps.

3. A vertical enclosure according to claim 1, wherein each flap is provided with a 90° flange along each side projecting inwardly of the enclosure.

4. A vertical enclosure according to claim 3, wherein the modules have flanks and the enclosure includes vertical bars provided with vertical grooves in two opposite faces, the grooves in one face receiving the flanges on the flaps, and the grooves in the opposite face receiving said flanks of the modules.

5. A vertical enclosure according to claim 4, wherein each flap is provided with an electrically conductive gasket interposed between the flap and one of said vertical bars of the enclosure.

6. A vertical enclosure according to claim 4, wherein each bar is symmetrical and is provided at two opposite faces with respective pairs of said vertical grooves which are laterally adjacent to each other.

7. A vertical enclosure according to claim 6, wherein each groove is provided with contact-enhancing projections.

8. A vertical enclosure according to claim 5, wherein each bar is made of aluminum.

9. A vertical enclosure according to claim 5, comprising a frame including a top plate and a bottom plate and two pins which pass through the bar and through a respective one of said top and bottom plates, thereby fixing the bar to the frame.

10. A vertical enclosure according to claim 1, wherein an empty space is left in said enclosure between the flaps and the modules, thereby producing a chimney effect in said enclosure for heat dissipation.

11. A station comprising a set of vertical enclosures according to claim 1, and wherein the two sides of the set are closed by respective removable side panels.

* * * * *